United States Patent
Mori et al.

(10) Patent No.: US 7,551,506 B2
(45) Date of Patent: Jun. 23, 2009

(54) SEMICONDUCTOR APPARATUS, SEMICONDUCTOR STORAGE APPARATUS, CONTROL SIGNAL GENERATION METHOD, AND REPLACING METHOD

(75) Inventors: Kenji Mori, Kanagawa (JP); Masayuki Takori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 317 days.

(21) Appl. No.: 11/634,955

(22) Filed: Dec. 7, 2006

(65) Prior Publication Data
US 2007/0140034 A1    Jun. 21, 2007

(30) Foreign Application Priority Data
Dec. 21, 2005    (JP)    ............................. 2005-367413

(51) Int. Cl.
*G11C 17/18*    (2006.01)
(52) U.S. Cl. ................ 365/225.7; 365/200; 365/189.05

(58) Field of Classification Search .............. 365/225.7, 365/189.05, 200
See application file for complete search history.

(56) References Cited

U.S. PATENT DOCUMENTS
6,011,735 A *   1/2000   Ooishi et al. ................ 365/200
6,434,065 B1 *  8/2002   Kobayashi et al. .......... 365/200

FOREIGN PATENT DOCUMENTS
JP    3-283196    12/1991
JP    4-188835    7/1992

* cited by examiner

*Primary Examiner*—Son Dinh
(74) *Attorney, Agent, or Firm*—McGinn IP Law Group, PLLC

(57) ABSTRACT

A semiconductor apparatus according to the present invention includes a plurality of electric fuses that can be disconnected electrically, a selection circuit selecting the plurality of electric fuses in response to a selection signal, a disconnection circuit disconnecting the selected plurality of electric fuses by passing a current, and a control signal generator generating a control signal that controls components to be controlled according to connection conditions of the plurality of the electric fuses.

14 Claims, 6 Drawing Sheets

SEMICONDUCTOR APPARATUS, SEMICONDUCTOR STORAGE APPARATUS, CONTROL SIGNAL GENERATION METHOD, AND REPLACING METHOD

BACKGROUND OF THE INVENTION

1. Field of the Invention

The present invention relates to a semiconductor apparatus, a semiconductor storage apparatus, a control signal generation method, and a replacing method, and particularly to a semiconductor apparatus, a semiconductor storage apparatus, a control signal generation method, and a replacing method including electric fuses electrically disconnectable.

2. Description of Related Art

In recent years, a nonvolatile storage unit for retaining stored information while power is off is a necessary element in a semiconductor apparatus. As such a nonvolatile storage unit, a fuse for irreversibly storing information is known in the art.

The fuse is used to replace a defective memory cell in a semiconductor storage apparatus. The semiconductor memory storage includes a redundant memory cell (redundant circuit) replacing a defect of a memory cell generated in manufacturing process, in order to improve yield ratio. In a test process, the defect of the memory cell is replaced by replacing the defective memory cell with a redundant memory cell. The fuse is used to store information such as an address identifying the defective memory cell.

The fuse stores information according to its connection condition. Thus bad disconnection such as insufficient disconnection causes a misrecognition in the stored information and circuit to be in a malfunction. Without replacing the defective memory cell with the redundant cell, the yield ratio is decreased. As a conventional technique for preventing a malfunction due to a poor connection of the fuse, techniques disclosed in Japanese Unexamined Patent Application Publication No. 3-283196 and Japanese Unexamined Patent Application Publication No. 4-188835 are known.

FIG. 6 is a circuit diagram showing a configuration of a conventional semiconductor apparatus similar to the one disclosed by Japanese Unexamined Patent Application Publication No. 3-283196. In this circuit, laser fuses 601a and 601b are disconnected simultaneously by laser. With either one of the laser fuses 701a to 701c being disconnected, the circuit operates as the fuse is being disconnected.

That is, with the laser fuses 601a and 601a being not disconnected, a current flows from a power supply voltage VDD through a resistance 604, thus a switch 603 is turned off. With either one of the laser fuses 601a or 601a being disconnected, the power supply voltage VDD and the resistance 604 is separated, thus the switch 603 is turned on and an output from an inverter 602 is output to an OUT terminal. Although not shown in the drawings, with the laser fuses 601a and 602b being not disconnected, the OUT terminal becomes floating. Thus depending on an signal of the inverter 602 being output to the OUT terminal or the OUT terminal becoming to be floating, a circuit is required for detecting connection/disconnection condition of the laser fuses 601a and 601b.

FIG. 7 is a circuit diagram showing a configuration of a conventional semiconductor apparatus similar to the one disclosed by Japanese Unexamined Patent Application Publication No. 4-188835. In this circuit, laser fuses 701a to 701c are connected in parallel. The laser fuses 701a to 701c are disconnected simultaneously by laser. With any one of the laser fuses 701a to 701c being disconnected, the circuit operates as the fuse is being disconnected.

Accordingly with the laser fuses 701a to 701c being not disconnected, a current flows from a power supply voltage VDD through resistances 703a to 703c. Thus low level is output from an NAND circuit 702 to an OUT terminal. With any one of the laser fuses 701a to 701c being disconnected, the power supply voltage VDD and any one of the resistance 703a to 701c is being separated. Thus high level is output from the NAND circuit 702 to the OUT terminal.

However there is a following problem due to the laser fuses that are disconnected by laser used as fuses in Japanese Unexamined Patent Application Publication No. 3-283196 and Japanese Unexamined Patent Application Publication No. 4-188835.

To disconnect the fuse by laser, laser is irradiated in a wafer condition, thus the fuses are disconnected in a wafer test process. At this time, the disconnection by laser needs to be performed by a fuse disconnection apparatus different from a wafer test apparatus. Therefore, after performing the wafer test by the wafer test apparatus to detect a defective memory cell, the wafer needs to be moved to the fuse disconnection apparatus to disconnect the fuses by laser, and then the wafer is tested by the wafer test apparatus that there is no defect in a replacement with a redundant cell. Accordingly more time is required for the test due to the apparatuses to be moved.

Furthermore, the number of fuses to be disconnected by a laser irradiation is limited, and there are various positions of the fuses to be disconnected for each chip. Thus the fuses to be disconnected for all chips over a wafer cannot be disconnected at a time. Accordingly positioning laser and a disconnection need to be repeated for a number of times, thereby increasing time taken for the test due to the disconnection of the fuse.

Because the fuses are disconnected by a laser irradiation, the fuses need to be exposed over a surface of the semiconductor chip. Thus lines cannot be disposed over and below the fuses in a region where an influence from the laser remains. Further, minimum size of the laser fuses is determined by a wavelength of a laser beam. Thus an area occupied by the laser fuses is increasing relatively to areas for other circuits that continue to reduce their sizes. Accordingly with a several dozens or hundreds of fuses formed over a semiconductor chip, the number of components on chip is reduced, creating a large constraint in a reduction of chip size.

There is another problem that in the circuits of FIGS. 6 and 7, a current flows from the power supply voltage VDD to the GND through fuses and resistances with the fuses being connected, thus the current is consumed at any time. It is possible to suppress the consuming current to some extent by appropriately selecting resistance value. However the increase in the consuming current due to non-disconnected fuses can be a huge issue in a circuit requiring several hundreds of fuses.

SUMMARY OF THE INVENTION

According an aspect of the present invention, there is provided a semiconductor apparatus that includes a plurality of electric fuses that can be disconnected electrically, a selection circuit selecting the plurality of electric fuses in response to a selection signal, a disconnection circuit disconnecting the selected plurality of electric fuses by passing a current, and a control signal generator generating a control signal that controls components to be controlled according to connection conditions of the plurality of the electric fuses. With this semiconductor apparatus, the fuses are electrically disconnected, thereby reducing time taken for test as well as chip size.

According another aspect of the present invention, there is provided a method for generating a control signal for controlling components to be controlled that includes selecting a plurality of electric fuses in response to a selection signal, disconnecting the selected plurality of electric fuses by passing a current, and generating a control signal according to connection conditions of the plurality of electric fuses. With this control signal generation method, the fuses are electrically disconnected, thereby reducing time taken for test as well as chip size.

According another aspect of the present invention, there is provided a semiconductor storage apparatus that includes a memory cell array having a plurality of memory cells disposed thereto, a redundant memory cell replacing a defective memory cell generated in the memory cell array, a plurality of electric fuses mounted to correspond to the redundant memory cell, a selection circuit selecting the plurality of electric fuses according to a selection signal indicating of the defective memory cell, a disconnection circuit disconnecting the selected plurality of electric fuses by passing a current, a replacing signal generator generating a replacing signal according to connection conditions of the plurality of electric fuses, and a switching circuit replacing the defective memory cell with the redundant memory cell according to the replacing signal. With semiconductor storage apparatus, the fuses are electrically disconnected, thereby reducing time taken for test as well as chip size.

According another aspect of the present invention, there is provided a method of replacing for replacing a defective cell in a semiconductor storage apparatus including a memory cell array having a plurality of memory cells disposed thereto, a plurality of redundant memory cells replacing a defective memory cell generated in the memory cell array, and a plurality of electric fuses mounted to correspond to the redundant memory cells, the method comprises selecting the plurality of electric fuses according to a selection signal indicating of the defective memory cell, disconnecting the plurality of electric fuses by passing a current, generating a replacing signal according to connection conditions of the plurality of electric fuses, and replacing the defective memory cell with the redundant memory cell according to the replacing signal. With this replacing method, the fuses are electrically disconnected, thereby reducing time taken for test as well as chip size.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A semiconductor apparatus of a first embodiment is described hereinafter in detail. The semiconductor apparatus of this embodiment disconnects a plurality of electric fuses connected in parallel by a current. With any of the electric fuses being disconnected, the semiconductor apparatus replaces a corresponding defective cell to a redundant cell.

Figure 1:
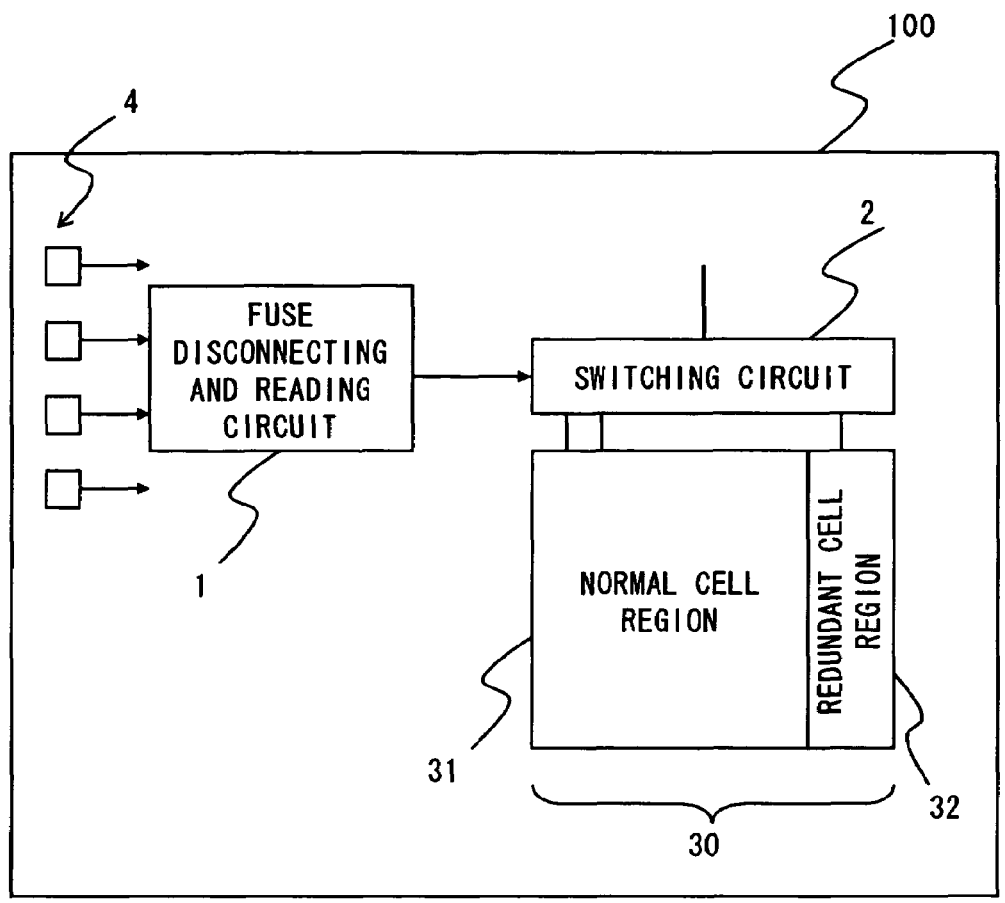
FIG. 1 is a configuration diagram illustrating a semiconductor apparatus according to the present invention.

A configuration of the semiconductor apparatus of this embodiment is described hereinafter. The semiconductor apparatus 100 is a semiconductor storage unit storing desired information in memory cells, for example. As shown in FIG. 1, the semiconductor apparatus 100 includes a fuse disconnecting and reading circuit 1, a switching circuit 2, a memory cell array 30, and an input/output pad 4.

The memory cell 30 is a memory such as a DRAM (Dynamic Random Access Memory) or a SRAM (Static Random Access Memory). A plurality of memory cells is disposed in a lattice to the memory cell array 30, for example. The memory cell array 30 includes a plurality of word lines in rows, a plurality of bit lines in columns, and memory cells at intersections of the word and bit lines. By a driving circuit (not shown) selecting a bit and word line and supplying a specified potential, desired information can be written or read out.

The memory cell array 30 further includes a normal cell region 31 and a redundant cell region 32. The normal cell region 31 is a region for storing information in non-defective memory cells. The redundant cell region 32 is a region replacing a defective cell (i.e. defective memory cell). A memory cell in the normal cell region 31 is referred to as a normal cell (normal memory cell). A memory cell in the redundant cell region 32 is referred to as a redundant cell (redundant memory cell). A defective cell detected in the normal cell region 31 is replaced with a redundant cell by a unit of bit line.

The switching circuit 2 replaces the defective cell in the normal cell region 31 with the redundant cell in the redundant cell region 32 according to a replacing signal from the fuse disconnecting and reading circuit 1. The switching circuit 2 replaces the defective cell with the redundant cell by switching a connection of a driving circuit for writing and reading and the bit line of the memory cell array 30. That is, the switching circuit 2 switches a bit line having an address indicated by the replacing signal with a bit line of the redundant bit line.

The fuse disconnecting and reading circuit 1, as described later in detail, includes a plurality of electric fuses as irreversible storage devices, disconnects and reads the plurality of electric fuses to generate the replacing signal. The electric fuses, which are formed by metal such as Al or Cu, can be electrically disconnected by applying a voltage and passing a current thereto. The plurality of electric fuses is also nonvolatile storage units for storing replacement information (defective cell information) replacing a defective cell with a redundant cell depending on its connection condition. For example the replacing information is an address of the defective cell (defective address).

The fuse disconnecting and reading circuit 1 disconnects the plurality of electric fuses according to a data signal being input and stores the replacement information. Then the fuse disconnecting and reading circuit 1 reads and latches the replacing information depending on the connection of the electric fuses and outputs a replacing signal to the switching circuit 2. The replacing signal is a signal for identifying the defective memory cell and replacing it with the redundant cell. The replacing signal is also a control signal for controlling the switching circuit 2 and the memory cell array 30.

The input/output pad 4 is an external terminal of the semiconductor apparatus 100 that inputs/outputs signals probed by an external tester and the like.

Figure 2:
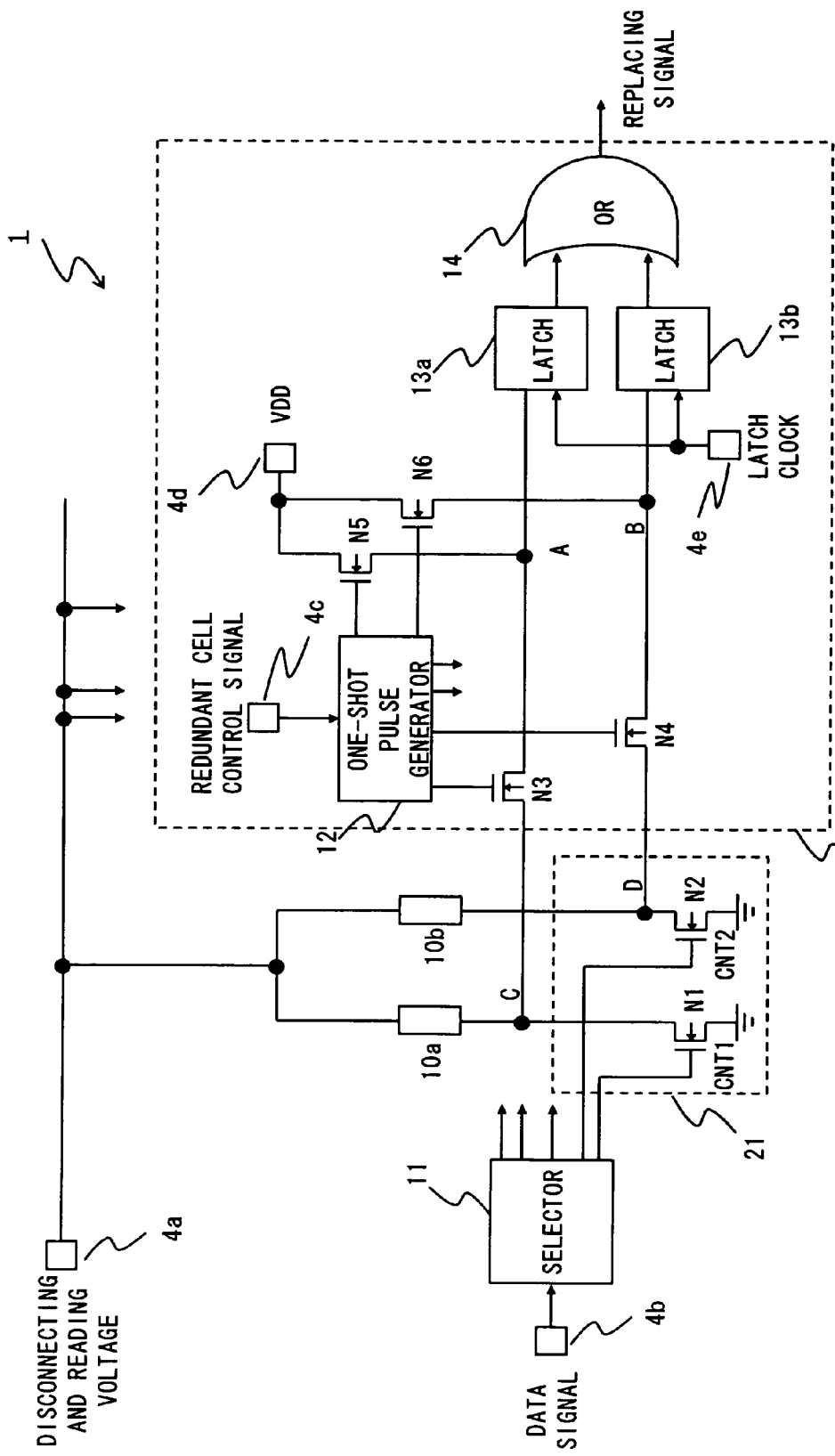
FIG. 2 is a configuration diagram illustrating a fuse disconnecting and reading circuit according to the present invention.

A configuration of the fuse disconnecting and reading circuit 1 of this embodiment is described hereinafter in detail with reference to FIG. 2. As shown in FIG. 2, the fuse disconnecting and reading circuit 1 includes electric fuses 10a and 10b, a selector 11, a disconnecting circuit 21, and a replacing signal generator 22.

The electric fuses 10a and 10b are storage devices for storing which defective cell to be replaced with a redundant cell. In this embodiment, the plurality of electric fuses 10a and 10b are provided for each cell to be replaced. That is, the electric fuses 10a and 10b are provided to correspond to a defective cell to be replaced with a redundant cell. For example the plurality of electric fuses correspond to one bit line (1 bit) of the memory cell array 30. Two electric fuses are connected in parallel in this example. However any number of electric fuses may be connected.

The selector 11 is a selection circuit selecting the electric fuses 10a and 10b corresponding to the defective cell according to the data signal (selection signal) being input. The data signal is for example an address of the defective cell. In this example, the selector 11 selects and disconnects the electric fuses 10a and 10b by outputting selection signals CNT1 and CNT2 to transistors N1 and N2 that are connected to the electric fuses 10a and 10b according to the data signal.

The disconnection circuit 21 disconnects the electric fuses by passing a current to the electric fuses 10a and 10b selected by the selector 11. The disconnection circuit 21 includes transistors (disconnection transistors) N1 and N2 for disconnecting the electric fuses. The transistor N1 is turned on in response to the selection signal CNT1 and disconnects the electric fuse 10a. The transistor N2 is turned on in response to the selection signal CNT2 and disconnects the electric fuse 10b. The transistors N1 and N2 are N channel type MOS transistors.

The replacing signal generator 22 generates the replacing signal according to the connection condition of the electric fuses 10a and 10b. Specifically, the replacing signal generator 22 reads and latches the connection condition of the electric fuses 10a and 10b and outputs the latched condition as the replacing signal.

The replacing signal generator 22 includes a one-shot pulse generator 12, transistors N3 to N6, latches 13a and 13b, and a or circuit 14. The transistors N3 to N6 are N channel type MOS transistors. The one-shot pulse generator 12 generates a one-shot pulse for reading the connection condition of the electric fuses 10a and 10b. The transistors (readout transistor) N3 to N6 read the connection condition of the electric fuses 10a and 10b in response to the one-shot pulse. The transistors N3 and N5 are for reading the electric fuse 10a. The transistors N4 and N6 are for reading the electric fuse 10b. The latches 13a and 13b retains the connection condition of the electric fuses 10a and 10b being read out. The latch 13a is for retaining the condition of the electric fuse 10a. The latch 13b is for retaining the condition of the electric fuse 10b. The OR circuit 14 outputs the replacing signal according to the latched connection condition. With either of the electric fuses 10a or 10b being disconnected, the OR circuit 14 outputs a signal for indicating that the fuse is disconnected, which is a signal replacing the defective cell with the redundant cell.

The input/output pad 4a is a terminal for inputting a disconnection and readout voltage, which is a standard voltage for disconnecting and reading the electric fuses. The input/output pad 4b is a terminal for inputting the data signal indicating the address of the defective cell to the selector 11. The input/output pad 4c is a terminal for inputting a redundant cell control signal for reading the electric fuses and latching (generation of the replacing signal) to the one-shot pulse generator 12. The input/output pad 4d is a terminal for supplying a power supply voltage VDD (high level signal) to the transistors N5 and N6 for reading the electric fuses. The input/output pad 4e is a terminal for inputting a latch clock for latching the connection condition of the electric fuses to the latches 13a and 13b.

A connection relationship of each components of the fuse disconnecting and reading circuit 1 is described hereinafter in detail. The electric fuses 10a and 10b are connected in parallel between the input/output pad 4a and GND. The electric fuse 10a and the transistor N1 are connected in series from the input/output pad towards the GND in this order.

That is, the disconnecting and reading voltage is supplied to one end of the electric fuses 10a and 10b from the input/output pad 4a. A drain of the transistor N1 is connected to another end of the electric fuse 10a. The transistor N1 has its gate supplied with the selection signal CNT1 from the selector 11, and its source connected to ground. Similarly, a drain of the transistor N2 is connected to another end of the electric fuse 10b. The transistor N2 has its gate supplied with the selection signal CNT2 from the selector 11, and its source connected to ground.

The transistor N1 is turned on by a high level input to its gate to connect one end of the electric fuse 10a and the GND. The transistor N2 is turned on by a high level input to its gate to connect one end of the electric fuse 10b and the GND.

The transistor N3 is connected to a node C between the electric fuse 10a and the transistor N1, having its gate supplied with the one-shot pulse from the one-shot generator 12 and its source connected to an input terminal of the latch 13a. The transistor N4 is connected to a node D between the electric fuse 10b and the transistor N2, having its gate supplied with the one-shot pulse from the one-shot generator 12 and its source connected to an input terminal of the latch 13b.

The transistor N5 has its drain supplied with the power supply voltage VDD from the input/output pad 4d, its gate supplied with the one-shot pulse from the one-shot pulse generator 12, and its source connected to a node A between the transistor N3 and the latch 13a. The transistor N6 has its drain supplied with the power supply voltage VDD from the input/output pad 4d , its gate supplied with the one-shot pulse from the one-shot pulse generator 12, and its source connected to a node B between the transistor N4 and the latch 13a.

The transistor N3 is turned on by a high level input to its gate to connect the nodes C and A. The transistor N4 is turned on by a high level input to its gate to connect the nodes D and B. The transistor N5 is turned on by a high level input to its gate to connect the power supply voltage VDD and the node A. The transistor N6 is turned on by a high level input to its gate to connect the power supply voltage VDD and the node B.

The latch 13a is input with a signal of the node A (logical point) between the transistors N3 and N5, synchronizes with a latch clock input from the input/output pad 4e, and retains and outputs a signal level (logical level) of the node A. The latch 13b is input with a signal of the node B (logical point) between the transistors N4 and N6, and retains and outputs a signal level (logical level) of the node B according to the latch clock input from the input/output pad 4e.

The OR circuit 14 is input with the output signal from the latches 13a and 13b and outputs a result of OR operation. Specifically, the OR circuit 14 outputs high level in case the output from either of the latch 13a or latch 13b is high level. The OR circuit 14 outputs low level in case the outputs from both latches are low level. A different circuit may be mounted instead of the OR circuit 14 as long as it performs similar operation as the OR circuit.

Figure 3:
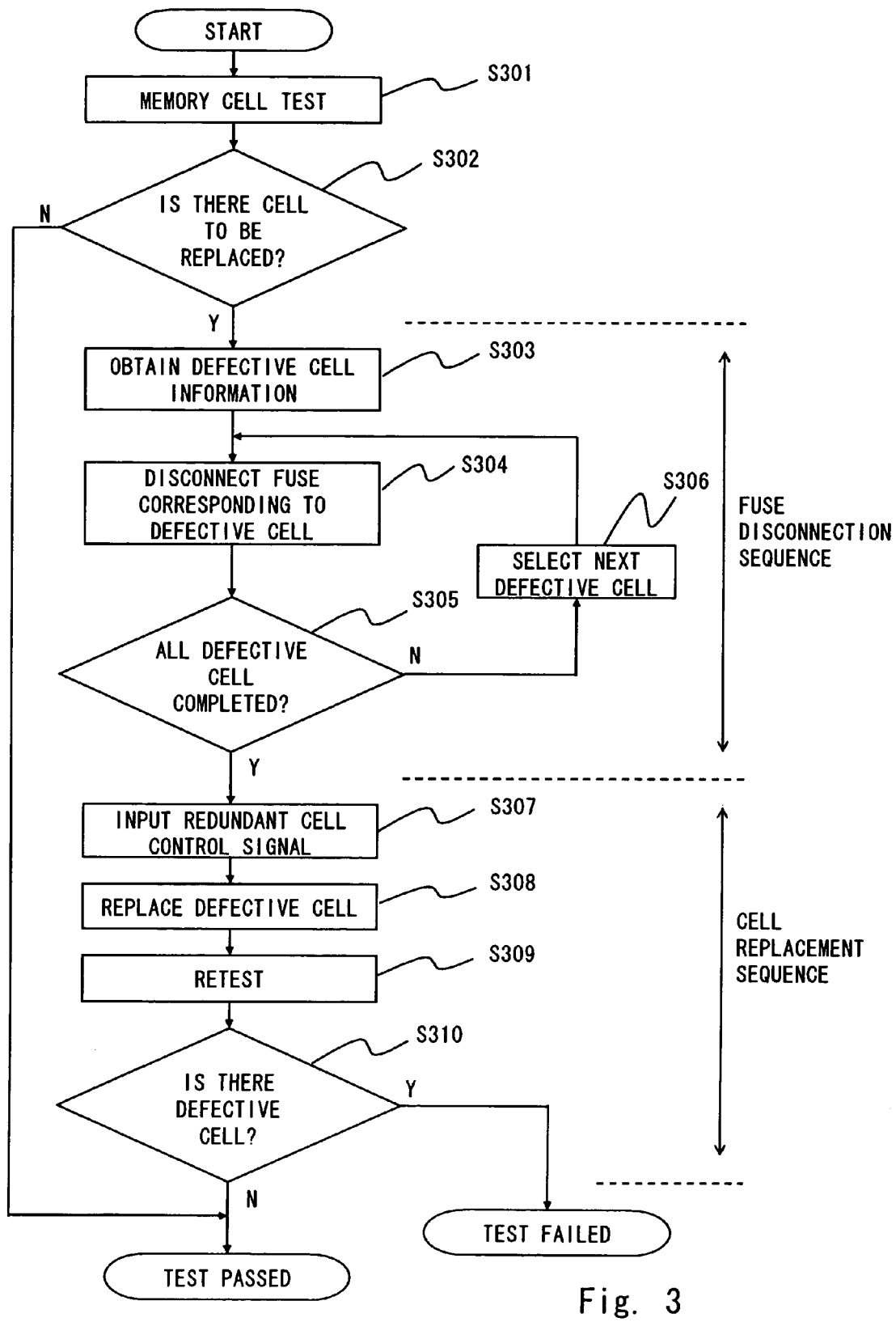
FIG. 3 is a flowchart illustrating a replacing method according to the present invention.

A method of replacing a defective cell of this embodiment is described hereinafter in detail with reference to a flowchart of FIG. 3. In this method, the defective cell is detected by a test in a test process such as a wafer test to replace the detected defective cell. In this embodiment, the defective cell is replaced by electrically disconnecting the fuses. Thus the following test and the replacement can be performed in a condition other than a wafer state, for example after being assembled. It is therefore possible to improve the yield ratio because the defective cell can be replaced in a test after being assembled.

Firstly a memory cell is tested by a test (S301). For example, the tester probes to the input/output pad 4, inputs a test pattern, and tests whether the writing and reading to/from the memory cells are successfully performed.

Then the tester evaluates whether there is any cell to be replaced (S302). In this embodiment, if evaluated that there is a defective cell with a problem as a result of the test in S301, it is evaluated as there is a cell to be replaced. If the problem is not detected, it is evaluated as there is no cell to be replaced. If evaluated that there is no cell to be replaced, the fuses need not to be disconnected and the replacement is not required. Thus the memory cell test is passed.

In S302, if evaluated that there is a cell to be replaced, a fuse disconnection sequence (S303 to S306) and a defective cell replacement sequence (S307 to S310) are performed.

In the fuse disconnection sequence, the tester obtains information of the defective cell (S303). Specifically the tester retains addresses of all the defective cells that failed in the test, and sequentially obtains the addresses of the defective cells.

Then the fuses corresponding to the defective cells are disconnected (S304). As described later in detail, in the fuse disconnecting and reading circuit 1, a voltage for disconnecting is applied to the input/output pad 4a. When the data signal indicating of the address of the defective cell is input to the input/output pad 4b, a current is passed to the electric fuses 10a and 10b corresponding to the defective cell to disconnect the electric fuses.

Then the tester evaluates whether the fuses are completed to be disconnected for all the defective cell (S305). In S305 if evaluated that the disconnection of the fuses is not completed, information of a next defective cell is obtained (S306) and a fuse corresponding to the defective cell is disconnected (S304). That is, until the fuses for all the defective cells are disconnected, the selection of the defective cell in S306 and the disconnection of the fuses in S304 are repeated.

In S305, in case the fuses are evaluated to be disconnected, the defective cell replacement sequence is performed. In the defective cell replacement sequence, high level is input as a redundant cell control signal from the input/output 4c by the tester (S307).

Then the fuse disconnecting and reading circuit 1 and the switching circuit 2 replaces the defective cell (S308). Specifically as described later in detail, the fuse disconnecting and reading circuit 1 reads the connection condition of the fuses and generates the replacing signal, and the switching circuit 2 replaces the defective cell with a redundant cell according to the replacing signal.

After that, the tester retests (S309) whether a portion in which the defective cell is replaced with a redundant cell successfully operates.

Then the tester evaluates whether there is any defective cell as a result of the retest (S310). Specifically, the tester evaluates whether there is a defect in the replaced redundant cell. If evaluated that there is no defective cell in S310, the test is passed because defective cells are replaced. Then the semiconductor apparatus is treated as non-defective. On the other hand if evaluated that there is defective cell, the test is failed because the defective cell is failed to be replaced. In this case the semiconductor apparatus is treated as defective.

A method of disconnecting and reading the fuses in this embodiment is described hereinafter in detail with reference to a timing chart of FIGS. 4A to 4F. In FIGS. 4A to 4F, an operation in a period of disconnecting fuses corresponds to S304 of FIG. 3. Further, an operation in a period of reading fuses corresponds to S307 and S308 of FIG. 3.

Figure 4:
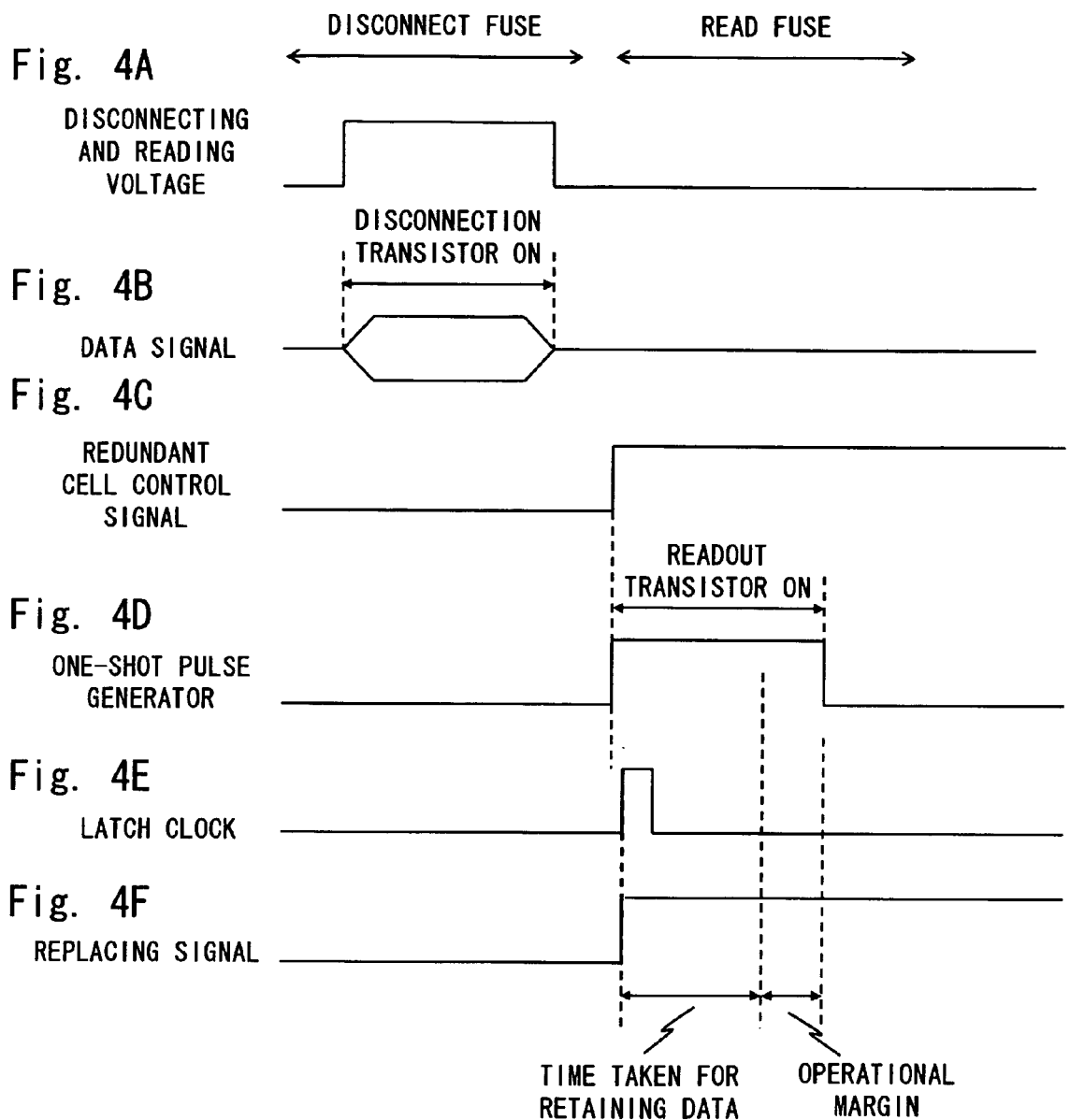
FIGS. 4A to 4F are timing charts illustrating a fuse disconnecting and reading operation according to the present invention.

In disconnecting the fuses as shown in FIG. 4A, any voltage (disconnection voltage) is applied to the input/output pad 4a as a disconnecting and reading voltage. The disconnection voltage applied at this time is a necessary voltage for disconnecting the electric fuses 10a and 10b and is far higher than the GND. The disconnection voltage has a higher value than the power supply voltage VDD, with 2V or 3V.

Subsequently as shown in FIG. 4B, the data signal indicating of the address of the defective cell is input to the input/output pad 4b. Then in the fuse disconnecting and reading circuit 1, the selector 11 disconnects the electric fuses 10a and 10b corresponding to the defective cell. Thus the selection signals CNT1 and CNT2 of the transistors N1 and N2 are set to high level and the transistors N1 and N2 are turned on. At this time, the redundant cell control signal is low level and the transistors N3 to N6 are turned off because the one-shot pulse is not generated.

Therefore, a current flows from the input/output pad 4a to the GND in an order of the electric fuse 10a to the transistor N1 at the same time as a current flows to the GND in an order of the electric fuse 10b to the transistor N2, so that the electric fuses 10a and 10b are disconnected by a blowout. Accordingly in this embodiment, the electric fuses 10a and 10b connected in parallel are selected and disconnected at a time in order to improve efficiency.

For memory cells with no defect, disconnection transistors for respective electric fuses are turned off and the electric fuses are not disconnected.

After the fuses are disconnected to read their connection condition, a readout voltage of the low level (GND) is applied as the disconnecting and reading voltage as shown in FIGS. 4A and 4B, and input of the data signal is stopped. Accordingly the selection signals CNT1 and CNT2 from the selector 11 become low level and the transistors N1 and N2 are turned off.

Then as shown in FIG. 4C, high level is input to the input/output pad 4c as the redundant cell control signal. After that as shown in FIG. 4D, the one-shot pulse is output from the one-shot pulse generator 12 in response to the redundant cell control signal. The one-shot pulse rises almost at a same timing as the redundant cell control signal. After a certain period, the one-shot pulse falls. The transistors N3 to N6 are turned on while the one-shot pulse is high level.

Then voltages of the nodes A and B are switched depending on the connection condition of the electric fuses 10a and 10b. With the electric fuses 10a and 10b being not disconnected (yet to be disconnected or in a poor connection), a current path is formed between the input/output pad 4d and the input/output pad 4a. Then a current flows from the input/output pad 4d to the input/output pad 4a in an order of the transistor N5, the transistor N3, and the electric fuse 10a, and a current flows from the input/output pad 4d to the input/output pad 4a in an order of the transistor N6, the transistor N4, and the electric fuse 10b. Therefore with the electric fuses 10a and 10b being not disconnected, the nodes A and B become low level (GND).

With the electric fuses 10a and 10b being (completely) disconnected, the transistor N3 is separated from the input/output pad 4a, and the transistor N4 is separated from the input/output pad 4a. Thus a current path is not formed between the input/output pads 4d and 4a. Then the nodes A and B become high level (VDD).

Then as shown in FIG. 4E in which logical levels of the nodes A and B are determined, a latch clock is input from the input/output pad 4e. For example the latch clock is input delayed to the redundant cell control signal, with a consideration over operation time of the one-shot pulse generator 12 and the transistors N3 to N6. This makes the latches 13a and 13b to latch the connection condition accurately. The latch clock may not be input externally but may be generated inside. For example the latch clock can be generated through a delay device such as an inverter from the redundant cell control signal.

With the latch clock being input as shown in FIG. 4F, the latches 13a and 13b retains the logical levels of the nodes A and B at a rising timing of the latch clock. Then the retaining condition of the latches 13a and 13b are output from the OR circuit 14 as a replacing signal. With either of the electric fuses 10a or 10b being disconnected, either of the nodes A or B becomes high level, and a high level is output from the OR circuit 14 as the replacing signal.

In this example, a period of the one-shot pulse (pulse width) is assumed to be a period including time required for the latches 13a and 13b to retain data and operational margin. In the period of the one-shot pulse, the transistors N3 to N6 are turned on and the levels of the nodes A and B are fixed. Thus the logical level corresponding to the connection condition of the electric fuses can definitely be latched. For example a pulse width of the one-shot pulse is below 1 msec.

In this embodiment, the electric fuses 10a and 10b connected in parallel are efficiently read out at a time to generate the replacing signal. After completing to retain data by the latches 13a and 13b, the one-shot pulse falls and the transistors N3 to N6 are turned off. However after the one-shot pulse falls, the redundant cell control signal may be set to low level.

In this example the redundant cell control signal is externally input at a specified timing in a test process. However in a actual operation after product shipment, the redundant cell control signal may be used together with a power on reset signal of the semiconductor apparatus. This enables to add a control flow for replacing a defective cell but the defective cell can be replaced automatically.

As described in the foregoing, in this embodiment, the defective cell is replaced depending on the connection condition of the plurality of electric fuses connected in parallel. There are poor connections such as an insufficient disconnection or an re-adhesion by a recrystallization of the fuses after a disconnection due to heat. However with any of the electric fuses being disconnected, the defective cell is replaced. Thus an incidence of such problems due to the poor connection can be reduced. Accordingly a malfunction in a circuit due to poor connection of the fuses can be prevented and the replacement with the redundant cell can surely be performed, thereby improving yield ratio of the semiconductor apparatus.

In this embodiment, electric fuses that are blowout by a current used instead of laser fuses as in a conventional technique. Therefore in the test process, a wafer needs not be moved between the test apparatus and the laser apparatus, and the fuses can be disconnected and read out by an electric control signal such as the data signal for changing a voltage applied externally and the selector. This enables to incorporate a defective cell replacement flow into a memory test performed in a wafer state. Furthermore the disconnection of the fuses is performed instantaneously by a current. Thus time taken to disconnect one fuse is a several dozens of msec. Accordingly a workflow for replacing a redundant cell in a test process can be simplified as well as the time required for the process can be reduced. Accordingly cost of manufacturing can be reduced.

Furthermore, there are constraints in a layout for the laser fuses. However for the electric fuses, components can be disposed over the fuses, thereby reducing chip size.

In this embodiment, all current paths for disconnecting and reading fuses are controlled by the transistors. Once read out from the fuses, the defective cells are replaced according to conditions of the latches regardless of the current that flows the fuses. Accordingly a current needs not to be passed through the fuses and the resistances, thereby reducing consuming current.

Second Embodiment

A semiconductor apparatus of a second embodiment is described hereinafter in detail. The semiconductor apparatus of this embodiment disconnects a plurality of electric fuses connected in series by a current. With any of the electric fuses being disconnected, the semiconductor apparatus replaces a corresponding defective cell with a redundant cell.

Figure 5:
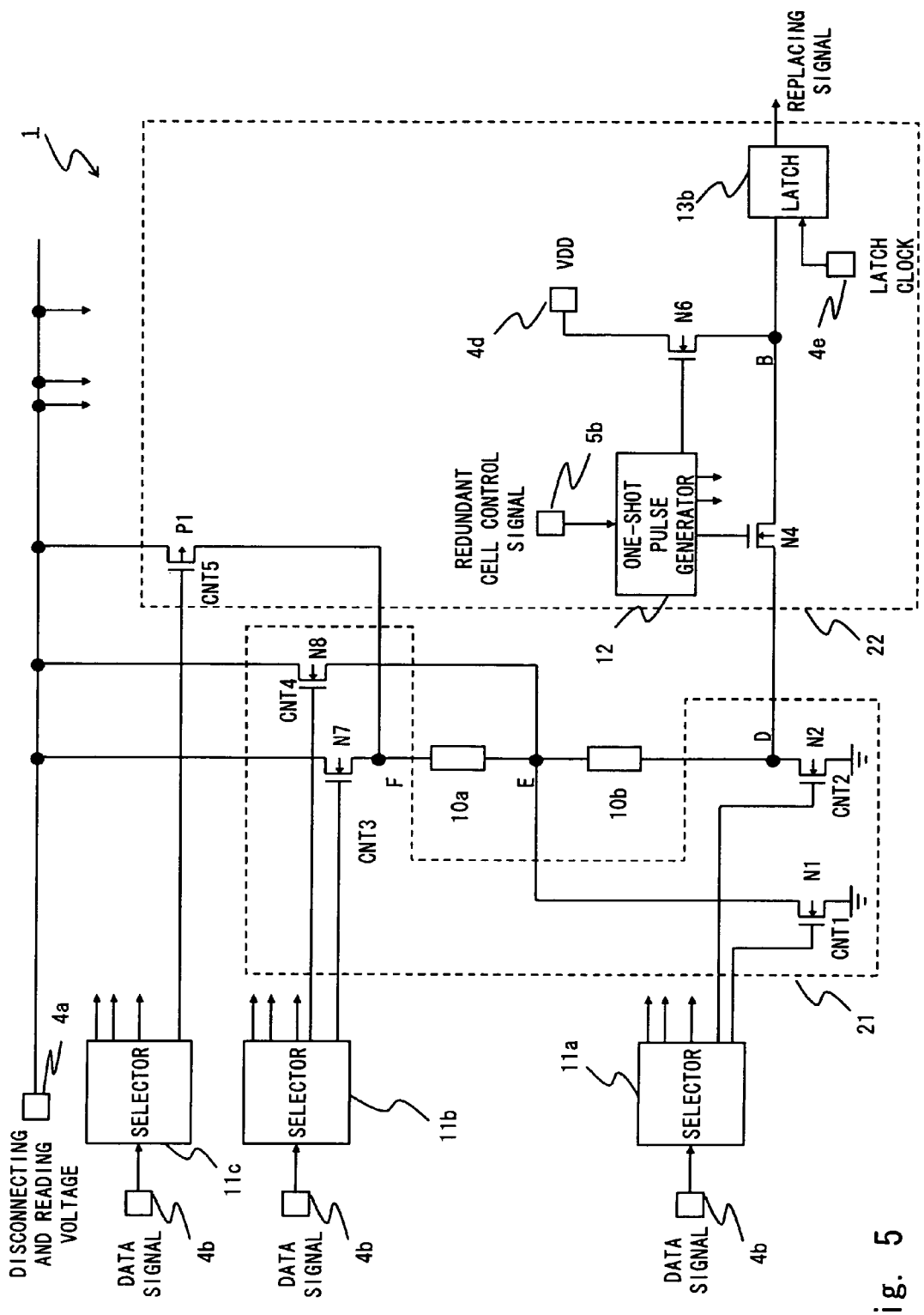
FIG. 5 is a configuration diagram illustrating the fuse disconnecting and reading circuit according to the present invention.
Figure 6:
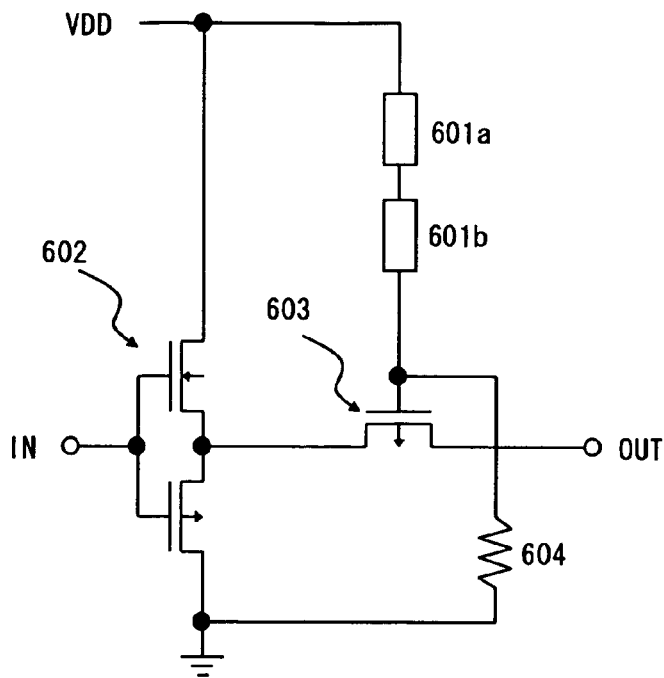
FIG. 6 is a configuration diagram illustrating a semiconductor apparatus according to a conventional technique.
Figure 7:
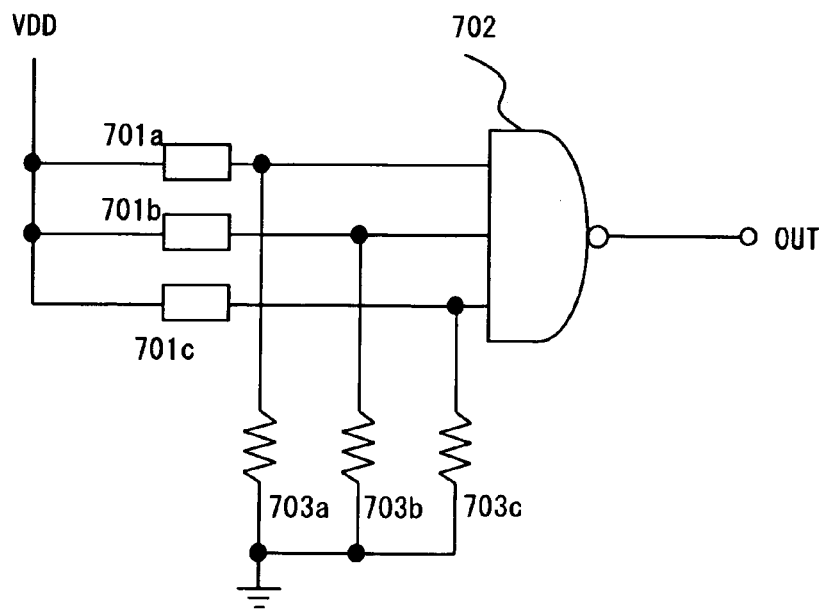
FIG. 7 is a configuration diagram illustrating a semiconductor apparatus according to a conventional technique.

A configuration of the semiconductor apparatus of this embodiment is identical to the one in FIG. 1, accordingly the explanation is not repeated here. A configuration of the fuse disconnecting and reading circuit 1 of this embodiment is described hereinafter in detail with reference to FIG. 5. In FIG. 5, components identical to those in FIG. 2 are denoted by reference numerals identical to those therein.

As shown in FIG. 5, the fuse disconnecting and reading circuit 1 includes electric fuses 10a and 10b, selectors 11a to 11c, a disconnecting circuit 21, and a replacing signal generator 22.

The electric fuses 10a and 10b are connected in series. The number of electric fuses connected in series is not limited to two but can be any number. The selectors 11a and 11b selects and controls the transistors N1, N2, N7, and N8 to disconnect the electric fuses 10a and 10b corresponding to a defective cell according to a data signal (selection signal) being input.

The disconnecting circuit 21 includes transistors (disconnecting transistors) N1, N2, N7, and N8 for disconnecting the electric fuses. The transistors N1, N2, N7, and N8 are N channel type MOS transistors each controlled over their power on and off by selection signals CNT1, CNT2, CNT3, and CNT4.

The replacing signal generator 22 includes a one-shot pulse generator 12, transistors (readout transistor) N4, N6, and P1, and a latch 13b. The transistors N4 and N6 are N channel type MOS transistors. The transistor P1 is a P channel type MOS transistor. The transistor P1 is controlled over its power on and off by a selection signal CNT5. In this embodiment, the electric fuses 10a and 10b are connected in series having one current path that flows the fuses. Thus the transistors N3 and N5, the latch 13a, and the OR circuit 14 in the first embodiment are not required.

A connection relationship of each component of the fuse disconnecting and reading circuit 1 is described hereinafter in detail. The electric fuses 10a and 10b are connected in series between the input/output pad 4a and the GND. The transistor N7 and the electric fuses 10a and 10b, and the transistor N2 are connected in series in this order from the input/output pad 4a towards the GND. The transistors N7 and P1 are connected in parallel. The transistor N7 and the electric fuse 10a and the transistor N8 are connected in parallel. Further, the electric fuse 10b, the transistors N2 and N1 are connected in parallel.

Specifically, the transistor N7 has its drain supplied with the disconnecting and reading voltage from the input/output pad 4a, its gate supplied with the selection signal CNT3 from the selector 11b, and its source connected to one end of the electric fuse 10a. Another end of the electric fuse 10a is connected to one end of the electric fuse 10b. The transistor N2 has its drain connected to another end of the electric fuse 10b, its gate supplied with the selection signal CNT2 from the selector 11a, and its source is connected to ground.

The transistor P1 has its source connected to the input/output pad 4a, its gate supplied with the selection signal CNT5 from the selector 11c, and its drain connected to a node F between the transistor N7 and the electric fuse 10a. The transistor N8 has its drain connected to the input/output pad 4a, its gate supplied with the selection signal CNT4 from the selector 11b, and its drain connected to a node E between the electric fuses 10a and 10b. The transistor N1 has its drain connected to the node E, its gate supplied with the selection signal CNT1 from the selector 11a, and its source connected to ground.

The transistor N1 is turned on by a high level input to its gate to connect one end of the electric fuse 10a and the GND. The transistor N2 is turned on by a high level input to its gate to connect one end of the electric fuse 10b and the GND. The transistor N7 is turned on by a high level input to its gate to connect the input/output pad 4a and one end of the electric fuse 10a. The transistor N8 is turned on by a high level input to its gate to connect the input/output pad 4a and one end of the electric fuse 10b. The transistor P1 is turned on by a low level input to its gate to connect the input/output pad 4a and one end of the electric fuse 10a.

The transistors N4 and N6, the one-shot pulse generator 12, and the latch 13b are connected in the same manner as the first embodiment. In this embodiment, the replacing signal is output directly from the latch 13b without going through the OR circuit.

The method of disconnecting and reading fuse is described hereinafter in detail. Firstly any voltage (disconnection voltage) is applied to the input/output pad 4a as the disconnecting and reading voltage, and the data signal is input to the input/output pad 4b.

Then the selectors 11a and 11b control the transistors N1, N2, N7, N8, and P1. After the electric fuse 10a is disconnected, the electric fuse 10b is disconnected. Specifically, the data signal is input, the selectors 11a and 11b set the selection signals CNT1 and CNT3 to high level, the transistors N1 and N7 are turned on, and the transistors N2, N8, and P1 are turned off. At this time, the redundant cell control signal is low level. As the one-shot pulse is not generated, the transistors N4 and N6 are turned off. Accordingly a current flows from the input/output pad 4a to the GND in order of the transistor N7, the electric fuse 10a, and the transistor N1, and then the electric fuse 10a is disconnected by a blowout.

After that the data signal is changed, and the selectors 11a and 11b set the selection signals CNT2 and CNT4 to high level, the transistors N2 and N8 are turned on, and the transistors N1, N7, and P1 are turned off. Accordingly a current flows from the input/output pad 4a to the GND in an order of the transistor N8, the electric fuse 10b, and the transistor N2 to disconnect the electric fuse 10b by a blowout. Thus in this embodiment, the electric fuses 10a and 10b connected in series are sequentially selected one by one and surely disconnected in an order of the selection.

After the fuses are disconnected and its connection condition is to be read, a readout voltage of low level (GND) is applied as a disconnecting and reading voltage. Then the data signal is stopped to be input to the selectors 11a and 11b. This turns off the transistors N1, N2, N7, and N8. At this time, the data signal is input to the selector 11c, the selection signal CNT5 becomes low level, and the transistor P1 is turned on. The transistor P1 may be controlled by a inversion signal of the one-shot pulse instead of the selector 11c.

Then as with the first embodiment, with a high level input to the redundant cell control signal, the one-shot pulse generator 12 outputs the one-shot pulse, the transistors N4 and N6 are turned on, and the replacing signal is generated depending on the connection condition of the electric fuses 10a and 10b. In this embodiment, the electric fuses 10a and 10b connected in series are efficiently read to generate the replacing signal.

If both of the electric fuses 10a and 10b are not disconnected (yet to be disconnected or in a poor connection), a current path is formed between the input/output pad 4d and 4a. Then a current flows from the input/output pad 4d to the input/output pad 4a in an order of the transistor N6, the transistor N4, the electric fuses 10b, 10a, and the transistor P1. Accordingly with the electric fuses 10a and 10b not being disconnected, the node B becomes low level (GND), the latch 13a latches, and a low level is output as a replacing signal.

With either of the electric fuses 10a or 10b being (completely) disconnected, the transistor N4 is separated from the transistor P1. Thus a current path is not formed between the input/output pads 4d and 4a, the node B becomes high level (VDD), the latch 13b latches, and a high level is output as a replacing signal.

As described in the foregoing, in this embodiment, the defective cell is replaced according to the connection condition of the plurality of the electric fuses connected in series. This prevents a malfunction caused by a bad disconnection as with the first embodiment. Further, by using the electric fuses, time taken for the test as well as chip size can be reduced.

Other Embodiment

In the above example, a circuit for generating a replacing signal to replace the defective cell by the fuse is described. However it is not limited to this but the circuits of FIGS. 2 and 5 may be a control signal generator for generating a control circuit that controls objects depending on the connection of the fuses.

Furthermore in this example, the signal is externally input to the fuse disconnecting and reading circuit 1 through the input/output pad 4. However signals may be generated inside the semiconductor apparatus 100 and input to the fuse disconnecting and reading circuit 1. Specifically, BIST (Built In Self Test) circuit for testing memory cells may be mounted inside the semiconductor apparatus 100 to perform the test for the memory cells to identify addresses of defective cells from test result in order to automatically disconnect the fuses and replace the defective cells.

It is apparent that the present invention is not limited to the above embodiment and it may be modified and changed without departing from the scope and spirit of the invention.

What is claimed is:

1. A semiconductor apparatus comprising:
    a plurality of electric fuses that can be disconnected electrically;
    a selection circuit selecting the plurality of electric fuses in response to a selection signal;
    a disconnection circuit disconnecting the selected plurality of electric fuses by passing a current; and
    a control signal generator generating a control signal that controls components to be controlled according to connection conditions of the plurality of the electric fuses.

2. The semiconductor apparatus according to claim 1, wherein with any of the plurality of electric fuses being disconnected, the control signal generator generates a control signal indicating the disconnection.

3. The semiconductor apparatus according to claim 1, wherein each of the plurality of electric fuses are connected in parallel.

4. The semiconductor apparatus according to claim 1, wherein each of the plurality of electric fuses are connected in series.

5. A method for generating a control signal for controlling components to be controlled comprising:
    selecting a plurality of electric fuses in response to a selection signal;
    disconnecting the selected plurality of electric fuses by passing a current; and
    generating a control signal according to connection conditions of the plurality of electric fuses.

6. A semiconductor storage apparatus comprising:
    a memory cell array having a plurality of memory cells disposed thereto;
    a redundant memory cell replacing a defective memory cell generated in the memory cell array;
    a plurality of electric fuses mounted to correspond to the redundant memory cell;
    a selection circuit selecting the plurality of electric fuses according to a selection signal indicating of the defective memory cell;
    a disconnection circuit disconnecting the selected plurality of electric fuses by passing a current;
    a replacing signal generator generating a replacing signal according to connection conditions of the plurality of electric fuses; and
    a switching circuit replacing the defective memory cell with the redundant memory cell according to the replacing signal.

7. The semiconductor apparatus according to claim 6, wherein with any of the plurality of electric fuses being disconnected, the replacing signal generator generates a replacing signal indicating the replacement.

8. The semiconductor storage apparatus according to claim 6, wherein each of the plurality of electric fuses are connected in parallel.

9. The semiconductor storage apparatus according to claim 8, wherein the selection circuit selects the plurality of electric fuses at a time, and the disconnection circuit disconnects the plurality of electric fuses at a time.

10. The semiconductor storage apparatus according to claim 6, wherein each of the plurality of electric fuses are connected in series.

11. The semiconductor storage apparatus according to claim 10, wherein the selection circuit sequentially selects the plurality of electric fuses, and the disconnection circuit disconnects the plurality of electric fuses in an order of the selection.

12. The semiconductor storage apparatus according to claim 6, wherein the replacing signal generator comprises:
    a pulse generator generating a one-shot pulse for reading the connection conditions of the plurality of electric fuses; and
    a latch circuit for retaining the connection conditions of the plurality of electric fuses and outputting the replacing signal according to the generated one-shot pulse.

13. The semiconductor storage apparatus according to claim 12, wherein a pulse width of the generated one-shot pulse is longer than a time for the latch circuit to complete an operation to retain.

14. A method of replacing for replacing a defective cell in a semiconductor storage apparatus including a memory cell array having a plurality of memory cells disposed thereto, a plurality of redundant memory cells replacing a defective memory cell generated in the memory cell array, and a plurality of electric fuses mounted to correspond to the redundant memory cells, the method comprising:
    selecting the plurality of electric fuses according to a selection signal indicating of the defective memory cell;
    disconnecting the plurality of electric fuses by passing a current;
    generating a replacing signal according to connection conditions of the plurality of electric fuses; and
    replacing the defective memory cell with the redundant memory cell according to the replacing signal.

* * * * *